US009976709B2

(12) United States Patent
Yi et al.

(10) Patent No.: US 9,976,709 B2
(45) Date of Patent: May 22, 2018

(54) METHOD FOR MAKING AN LED LIGHTING FIXTURE

(71) Applicant: Taiwan Green Point Enterprises Co., Ltd., Taichung (TW)

(72) Inventors: Sheng-Hung Yi, Taichung (TW); I-Lin Tseng, Taichung (TW); Po-Cheng Huang, Taichung (TW); Hui-Ju Yang, Taichung (TW)

(73) Assignee: Taiwan Green Point Enterprises Co., Ltd., Taichung (TW)

(*) Notice: Subject to any disclaimer, the term of this patent is extended or adjusted under 35 U.S.C. 154(b) by 233 days.

(21) Appl. No.: 15/150,914

(22) Filed: May 10, 2016

(65) Prior Publication Data

US 2016/0334067 A1 Nov. 17, 2016

(30) Foreign Application Priority Data

May 11, 2015 (TW) ............................ 104114909 A

(51) Int. Cl.
*H05K 3/30* (2006.01)
*F21K 9/90* (2016.01)
*F21K 9/232* (2016.01)
*F21Y 107/50* (2016.01)
*F21Y 107/30* (2016.01)
*F21Y 107/80* (2016.01)

(52) U.S. Cl.
CPC ................ *F21K 9/90* (2013.01); *F21K 9/232* (2016.08); *F21Y 2107/30* (2016.08); *F21Y 2107/50* (2016.08); *F21Y 2107/80* (2016.08); *Y10T 29/4913* (2015.01)

(58) Field of Classification Search
CPC ............ F21Y 2115/10; H05B 33/0803; Y10T 29/49002; Y10T 29/49117; Y10T 29/4913; Y10T 428/24545; F21S 41/141; F21S 43/14; H05K 2201/10106
USPC .......... 29/832, 428, 432, 829, 835, 844, 846
See application file for complete search history.

(56) References Cited

U.S. PATENT DOCUMENTS 8,581,274 B2 11/2013 Horie
9,217,542 B2 * 12/2015 Pickard .................. F21K 9/135
9,717,119 B2 * 7/2017 Rodinger ........... H05B 33/0806

FOREIGN PATENT DOCUMENTS

CN 101479858 A 7/2009
TW M374539 U1 2/2010
TW I413745 B 11/2013

* cited by examiner

*Primary Examiner* — Thiem Phan
(74) *Attorney, Agent, or Firm* — Volpe and Koenig, P.C.

(57) ABSTRACT

A method for making an LED lighting fixture includes the steps of: a) cutting a flat blank to form a flat plate including a central piece having a central region and a circumferential region, and a plurality of peripheral extensions; b) forming on the flat plate a patterned circuit which includes a plurality of electrical contact pairs that are formed on the central piece or the peripheral extensions; c) bringing a plurality of LED dies into electrical contact with the electrical contact pairs, respectively; and d) bending the peripheral extensions rearwardly relative to the central piece and toward the central axis to form a shell.

10 Claims, 21 Drawing Sheets

METHOD FOR MAKING AN LED LIGHTING FIXTURE

CROSS-REFERENCE TO RELATED APPLICATION

This application claims priority of Taiwanese Patent Application No. 104114909, filed on May 11, 2015, which is incorporated by reference as if fully set forth.

FIELD

The disclosure relates to a method for making an LED lighting fixture, and more particularly to a method for making an LED lighting fixture in which a plurality of LED dies are oriented in various directions, and which can achieve a superior heat dissipation effect.

BACKGROUND

Taiwanese Patent No. 1413745 discloses a method for manufacturing a lamp body and the lamp body manufactured thereby. As shown in FIG. 1, the lamp body includes a lamp body carrier board unit 11, a plurality of strips 12, a luminous unit 13, and a combining unit 14. The strips 12 are arranged at a peripheral edge of the lamp body carrier board unit 11 in a radiating manner and have a bending angle relative to the lamp body carrier board unit 11. The luminous unit 13 is mounted on the lamp body carrier board unit 11. The combining unit 14 is mechanically connected to the strips 12 through a locking sleeve 15 and a plurality of rivets 16.

Since the luminous unit 13 is mounted on the lamp body carrier board unit 11 which is substantially horizontal, light produced by the luminous unit 13 travels mainly in one direction, e.g., a downward direction so that some areas around the luminous unit 13 are not sufficiently illuminated. In addition, since the combining unit 14 is mechanically connected to the strips 12 through the locking sleeve 15 and the rivets 16, the assembly of the lamp body is time-consuming and the production cost for the lamp body is relatively high.

SUMMARY

Certain embodiments of the disclosure provide a method for making an LED lighting fixture that may alleviate at least one of the aforementioned drawbacks of the prior art. Such a method may include the steps of:

a) cutting a flat blank to form a flat plate including a central piece having a central region defining a central axis and a circumferential region surrounding the central region, and a plurality of peripheral extensions which extend radially from the circumferential region and which are angularly displaced from each other about the central axis;

b) forming on the flat plate a patterned circuit which includes a plurality of electrical contact pairs that are formed on the central piece or the peripheral extensions and that are angularly displaced from each other about the central axis;

c) bringing a plurality of LED dies into electrical contact with the electrical contact pairs respectively; and d) bending the peripheral extensions rearwardly relative to the central piece and toward the central axis to collectively form a shell.

Certain embodiments of the disclosure provide a method for making an LED lighting fixture that may alleviate at least one of the aforementioned drawbacks of the prior art. Such a method may include the steps of:

a1) cutting a flat blank to form a rectangular flat plate including an upper marginal portion, a lower marginal portion opposite to the upper marginal portion in a longitudinal direction, and a body portion disposed between the upper and lower marginal portions;

b1) forming on the body portion of the rectangular flat plate a patterned circuit which includes a plurality of electrical contact pairs that are displaced from each other;

c1) bringing a plurality of LED dies into electrical contact with the electrical contact pairs, respectively; and d1) rolling up the rectangular flat plate around an axis oriented in the longitudinal direction to form a tubular shell.

BRIEF DESCRIPTION OF THE DRAWINGS

Other features and advantages of the disclosure will become apparent in the following detailed description of the exemplary embodiment (s) with reference to the accompanying drawings, of which.

DETAILED DESCRIPTION

Figure 1:
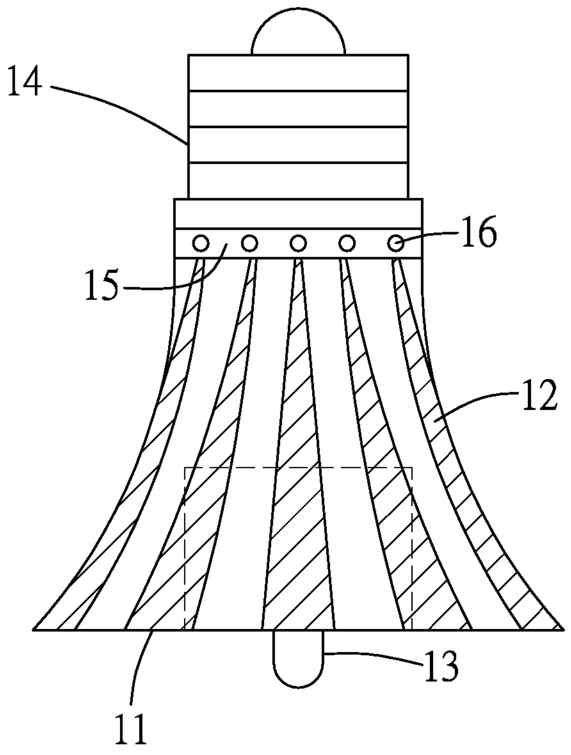
FIG. 1 PRIOR ART
FIG. 1 is a side view illustrating a lamp body disclosed in Taiwanese Patent No. 1413745.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
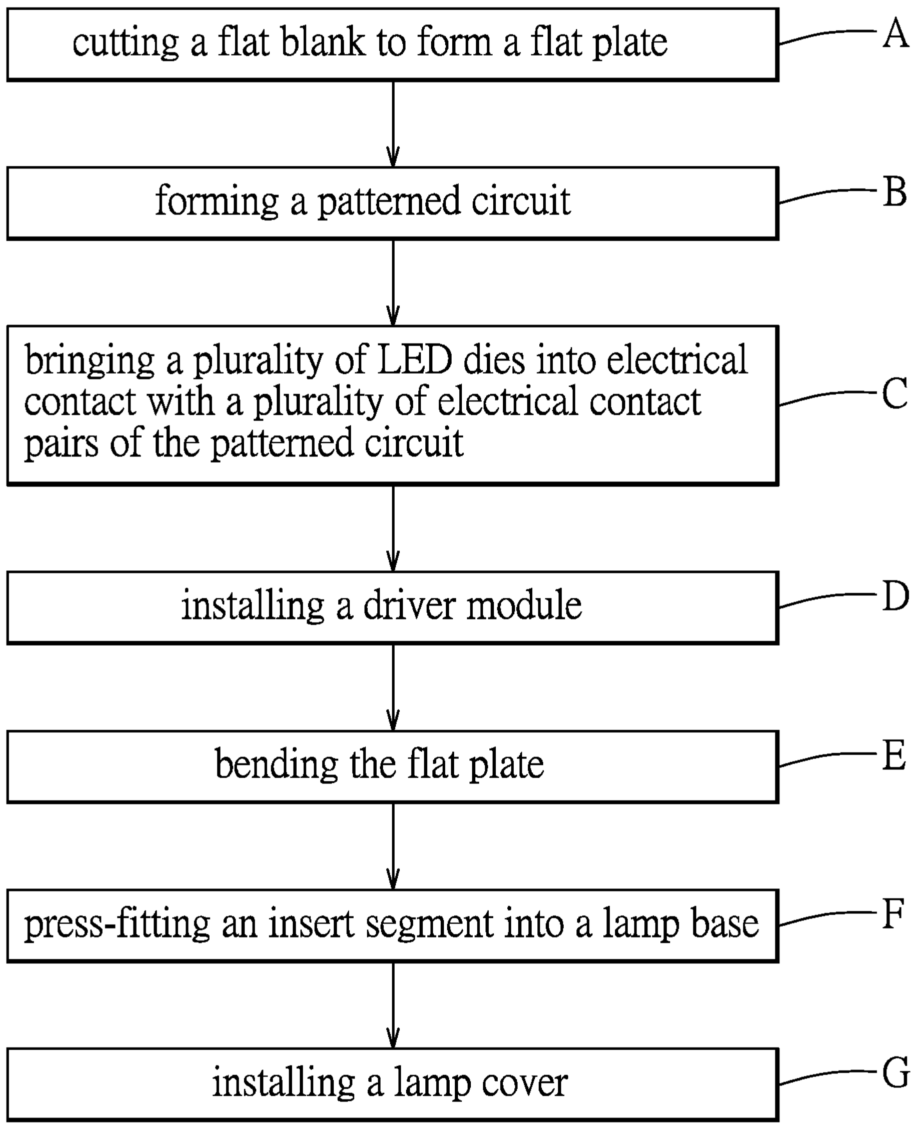
FIG. 2 is a flow diagram of a first embodiment of a method for making an LED lighting fixture according to the disclosure.

Referring to FIG. 2, a first embodiment of a method for making an LED lighting fixture according to the disclosure is shown to include the steps of: A) cutting a flat blank to form a flat plate; B) forming a patterned circuit; C) bringing a plurality of LED dies into electrical contact with electrical contact pairs of the patterned circuit; D) installing a driver module; E) bending the flat plate; F) press-fitting an insert segment into a lamp base; and G) installing a lamp cover.

Figure 3:
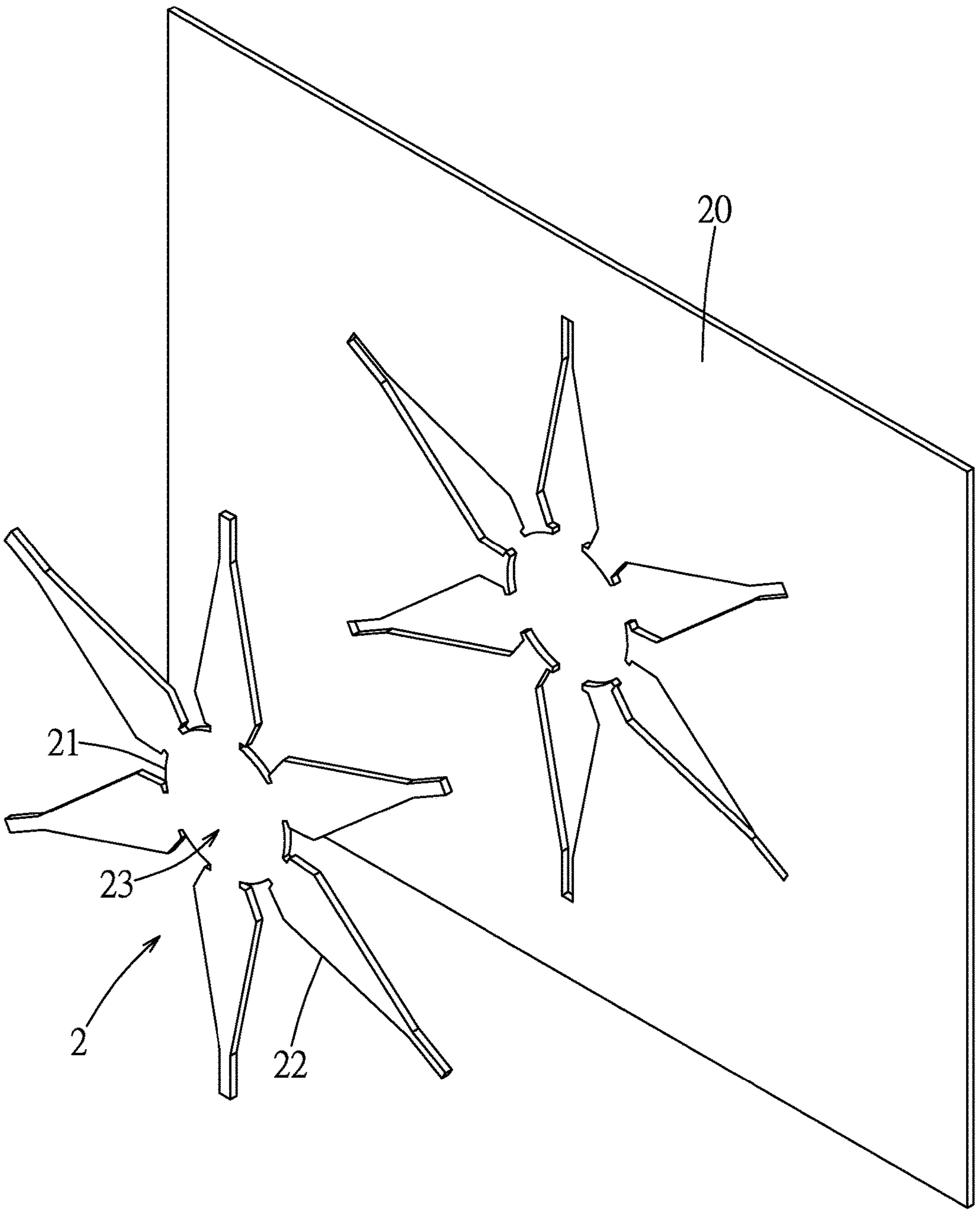
FIG. 3 is a schematic perspective view illustrating a cutting step of the first embodiment.
Figure 4:
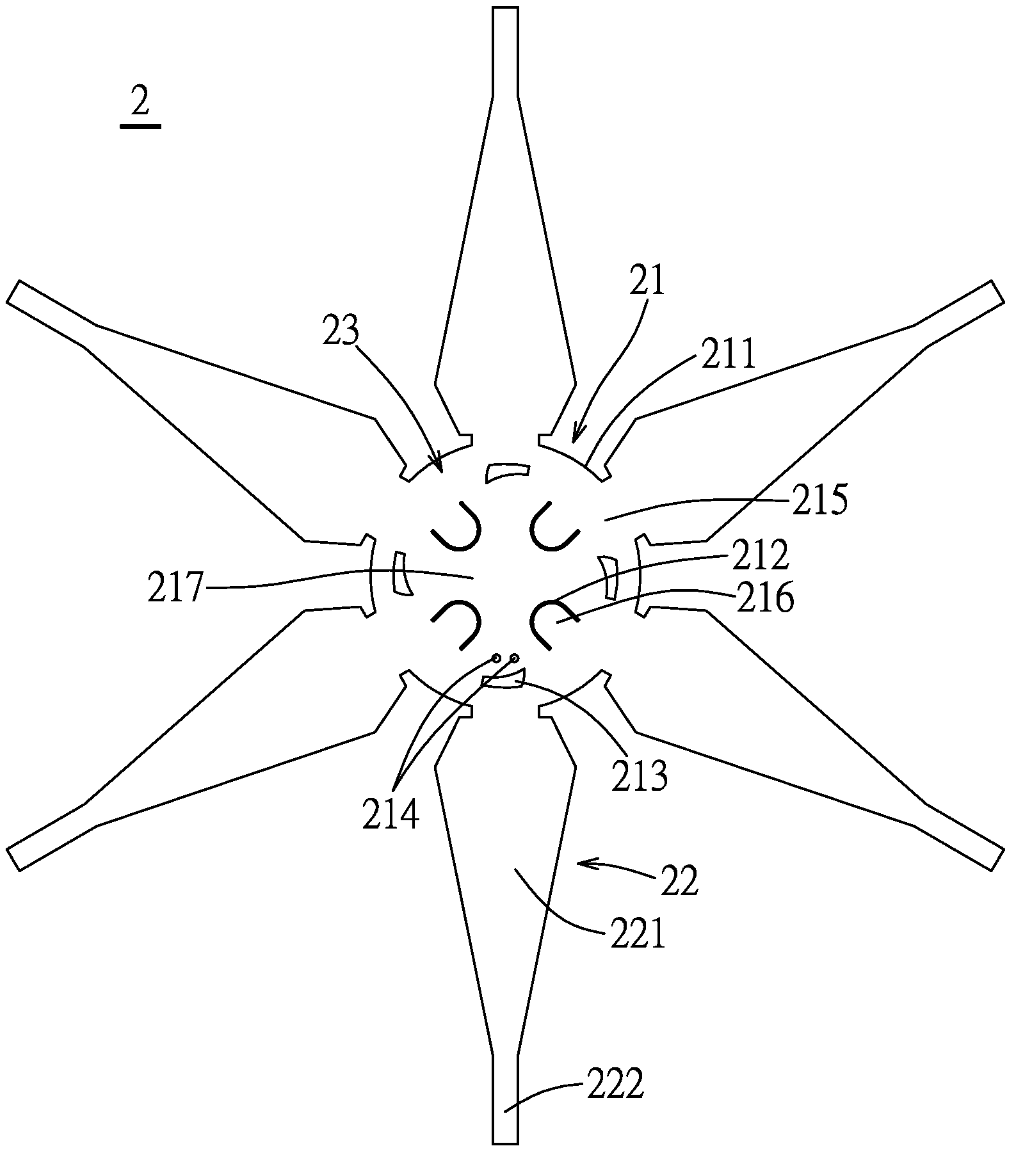
FIG. 4 is a schematic view of a flat plate obtained after the cutting step.
Figure 5:
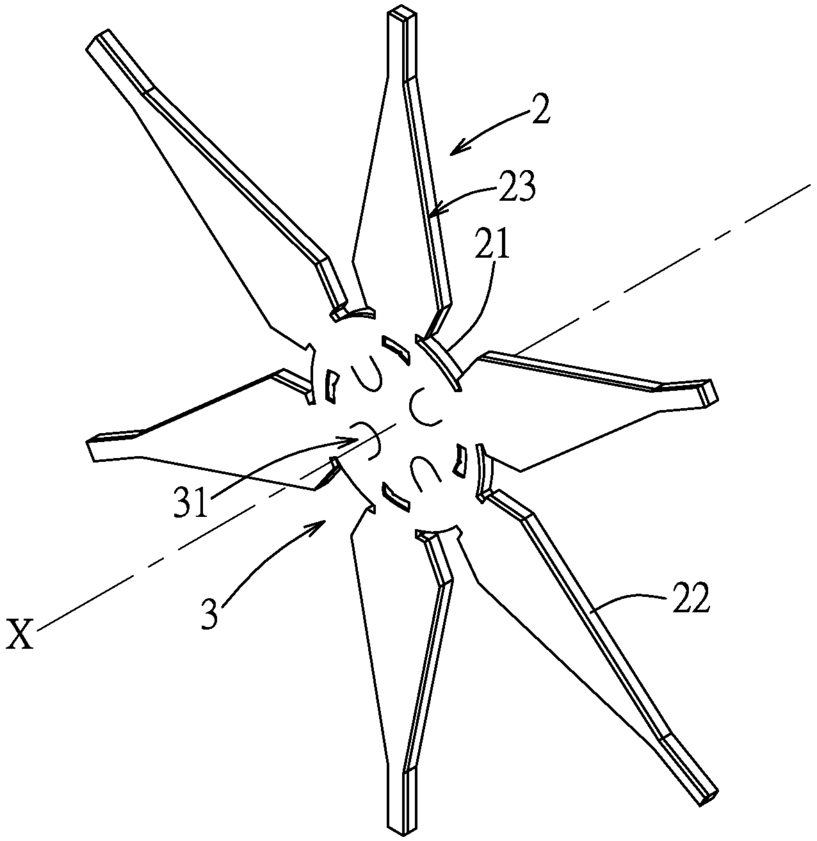
FIG. 5 is a perspective view of the flat plate obtained after a step of applying an insulation layer of the first embodiment.
Figure 6:
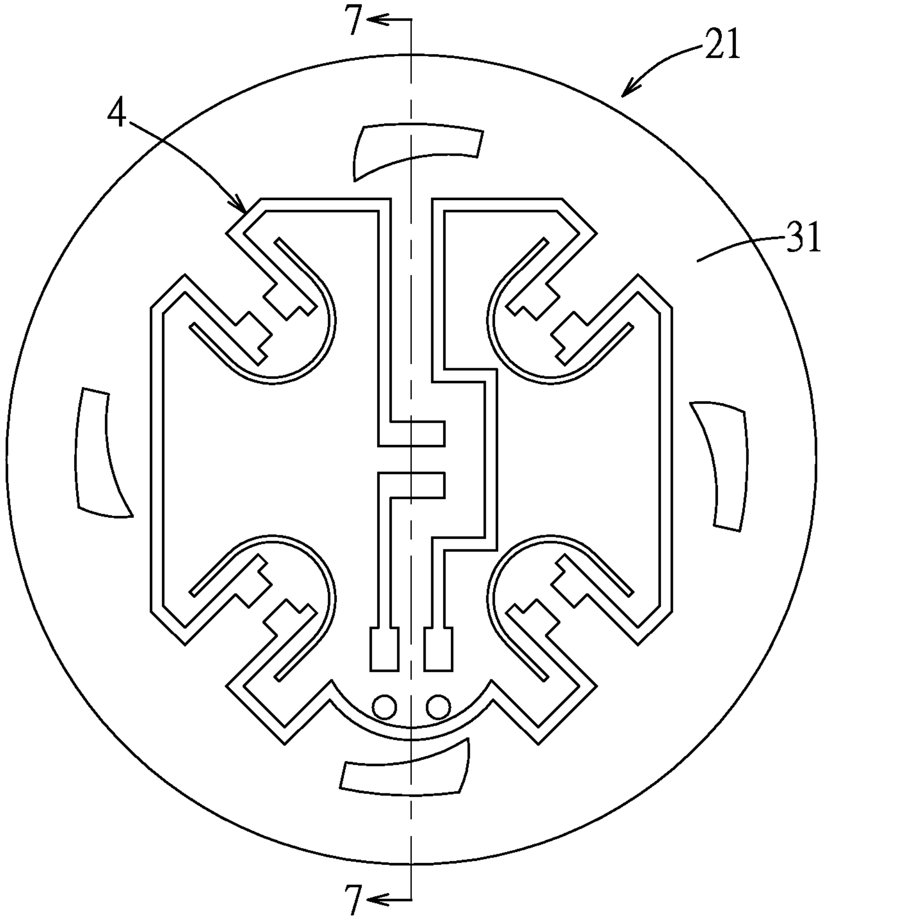
FIG. 6 is a schematic view of a central piece of the flat plate in a state in which a patterned activating material layer is formed on the insulation layer.
Figure 7:
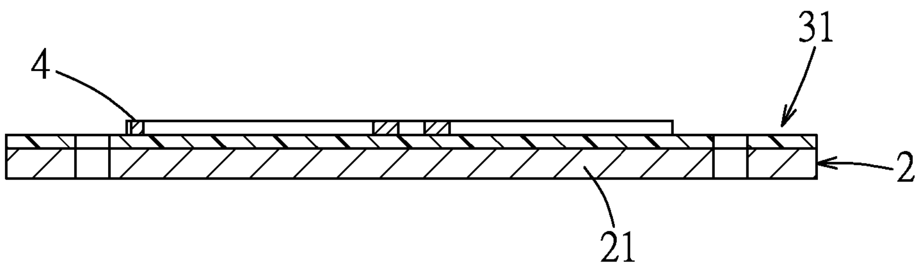
FIG. 7 is a sectional view taken long line 7-7 of FIG. 6.
Figure 8:
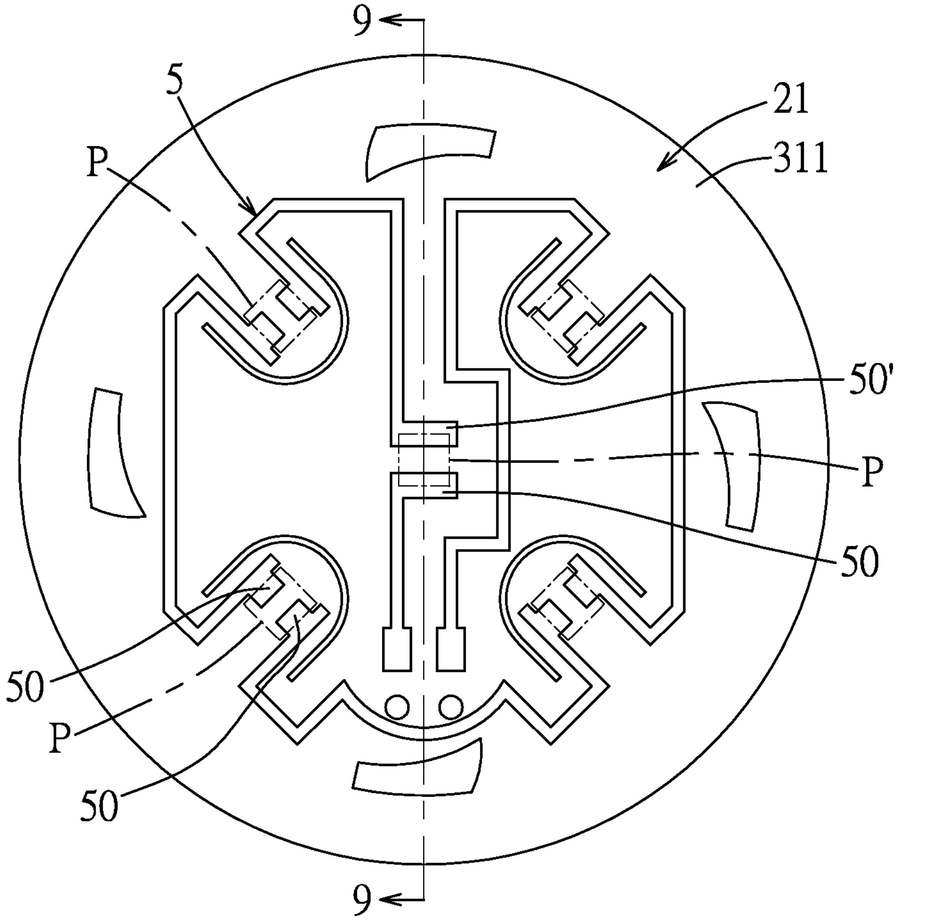
FIG. 8 is a schematic view of the central piece of the flat plate in a state in which a patterned circuit is formed on the patterned activating material layer.
Figure 9:
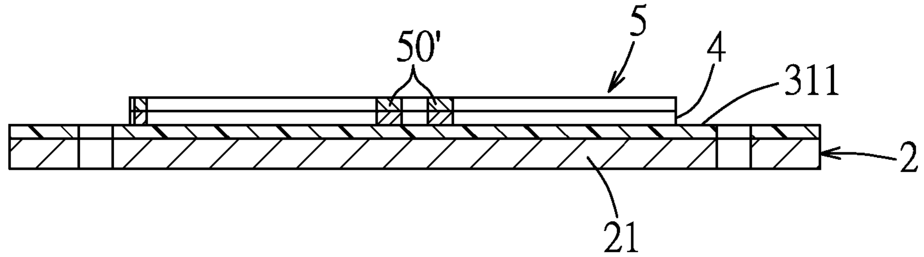
FIG. 9 is a sectional view taken long line 9-9 of FIG. 8.

Referring to FIGS. 3, 4, and 5, in step A), a flat blank 20 is cut using a machine tool (not shown) to form a flat plate 2. The machining process for forming the flat plate 2 includes, for example, laser cutting and punching. In this embodiment, the flat blank 20 and the flat plate 2 formed therefrom are made from a metal plate having superior thermal conductivity and heat dissipation (for example, an aluminum or copper plate). The flat plate 2 has an outer surface 23, and includes a central piece 21 and a plurality of peripheral extensions 22. The central piece 21 is illustrated in the embodiment as having a circular shape, and has a central region 217 defining a central axis (X) and a circumferential region 215 surrounding the central region 217. The peripheral extensions 22 extend radially outward from a periphery 211 of the circumferential region 215 and are angularly displaced from each other about the central axis (X). Each of the peripheral extensions 22 includes an elongate portion 221 extending radially outward from the periphery 211 of the circumferential region 215 and a distal end portion 222 opposite to the circumferential region 215.

In addition, the circumferential region 215 is cut to form a plurality of slits 212 which are angularly displaced from each other about the central axis (X) so as to form a plurality of flap portions 216 each having a free end proximate to the central region 217 and a bent line radially opposite to the free end. Each of the slits 212 is in a U-shaped form in the illustrated embodiment. Alternatively, the slit 212 may be in a V- or C-shaped form. In addition, the circumferential region 215 is cut to form a plurality of slots 213 and two through-holes 214.

When the flat plate 2 is made from a metal plate as illustrated in the embodiment, a layer of epoxy resin is applied to the outer surface 23 of the flat plate 2 via electrophoretic deposition to provide the flat plate 2 with an insulation layer 3 having an insulation surface 31, as shown in FIG. 5. Other insulation materials and other application techniques commonly used in the art may be used for forming the insulation layer 3, if applicable.

Alternatively, the flat plate 2 may be formed by cutting a flat blank made from an insulation flat blank. In this case, it is not necessary to further apply an insulation layer to the flat plate 2.

Referring to FIGS. 6, 7, 8, and 9, in step B), a patterned activating material layer 4 is formed on the insulation surface 31 of the flat plate 2 via screen printing, spray coating, transfer printing, or other application techniques commonly used in the art, and is then cured via heating or ultraviolet irradiation. Specifically, the patterned activating material layer 4 is formed on the central piece 21 of the flat plate 2. Chemical plating is then performed on the patterned activating material layer 4 to form a patterned circuit 5 on the patterned activating material layer 4.

In the embodiment, the patterned activating material layer 4 is formed using an ink which includes a catalystic metal source, an organic solvent, and an adhesive. The catalystic metal source is selected from the group consisting of palladium, platinum, gold, silver, copper, and combinations thereof.

Alternatively, the patterned activating material layer 4 may be formed using a material containing the catalystic metal source via powder coating, or by immersing the flat plate 2 in a solution containing the catalystic metal source for a predetermined period of time to form an activating material layer on the flat plate 2, followed by removal of unwanted portions of the activating material layer.

As described above, the patterned circuit 5 is formed on the patterned activating material layer 4 via chemical plating. Specifically, the flat plate 2 formed with the patterned activating material layer 4 on the insulation surface 31 is immersed in a chemical plating solution. Metal ions contained in the chemical plating solution are reduced to metal nuclei at the catalystic metal source of the patterned activating material layer 4. The metal nuclei thus formed act as a catalystic material for further reduction of the metal ions remaining in the chemical plating solution so as to form the patterned circuit 5 on the patterned activating material layer 4. In the embodiment, the patterned circuit 5 is made from a metal material having high heat conductivity (K) and low resistivity (ρ) (for example, copper).

Alternatively, step B) of forming the patterned circuit 5 may include the sub-steps of: i) forming an activating material layer on the insulation surface 31 of the flat plate 2; ii) performing chemical plating on the activating material layer to form an electrical conductive layer on the activating material layer; and iii) removing unwanted portions of the activating material and electrical conductive layers.

In addition, other techniques for forming a patterned circuit on an insulation surface, for example, a laser direct structuring technique or a molded interconnect device technique, may be used for forming the patterned circuit 5.

The patterned circuit 5 includes a plurality of electrical contact pairs 50 that are formed on the central piece 21 and are angularly displaced from each other about the central axis (X). The flap portions 216 in the circumferential region 115 have the electrical contact pairs 50 formed respectively thereon. The patterned circuit 5 further includes an electrical contact pair 50' formed on the central piece 21 other than the flap portions 216. Each of electrical contact pairs 50, 50' defines a mounting position (P).

Figure 10:
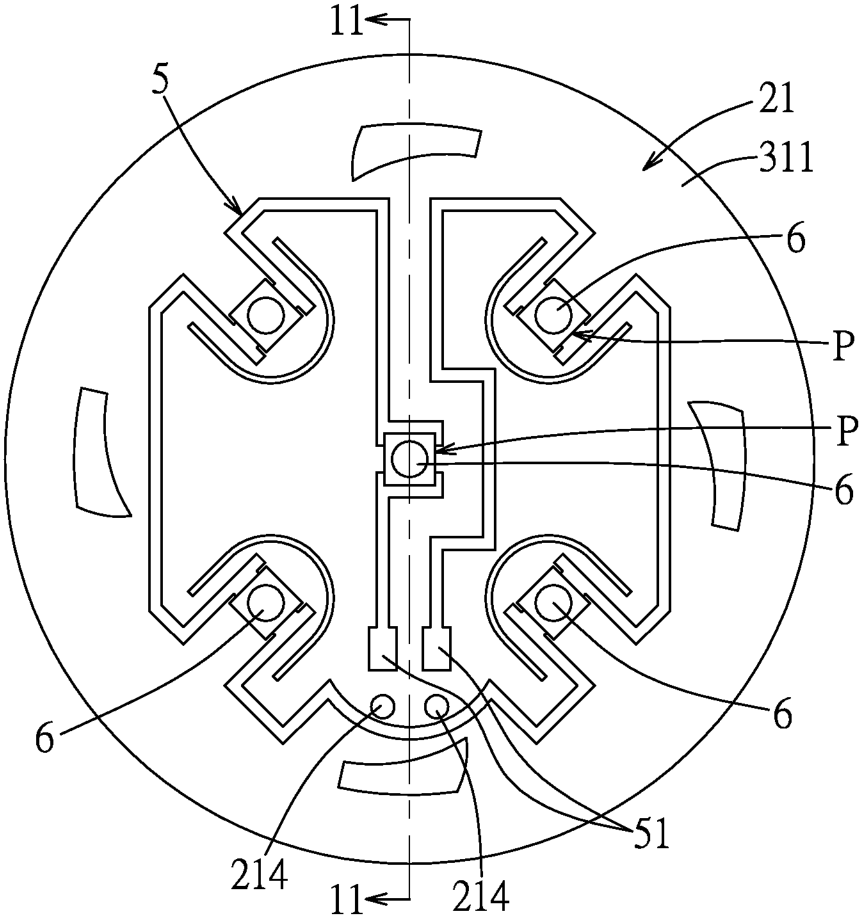
FIG. 10 is a schematic view of the central piece of the flat plate in a state in which a plurality of LED dies are in electrical contact with electrical contact pairs of the patterned circuit.
Figure 11:
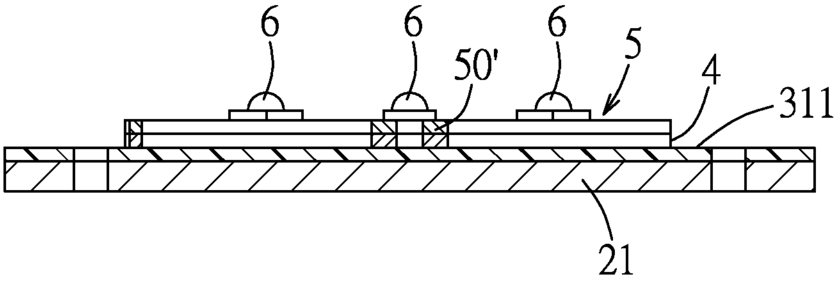
FIG. 11 is a sectional view taken long line 11-11 of FIG. 10.
Figure 12:
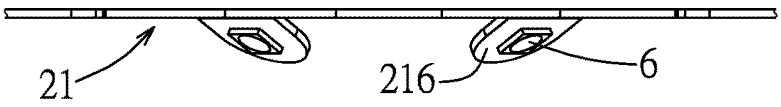
FIG. 12 is a side view of the central piece of the flat plate in a state in which a plurality of flap portions are bent.

Referring to FIGS. 10 and 11, in step C), a plurality of LED dies 6 are respectively mounted at the mounting positions (P) and brought into electrical contact with the electrical contact pairs 50, 50' via surface mounting technology.

Figure 14:
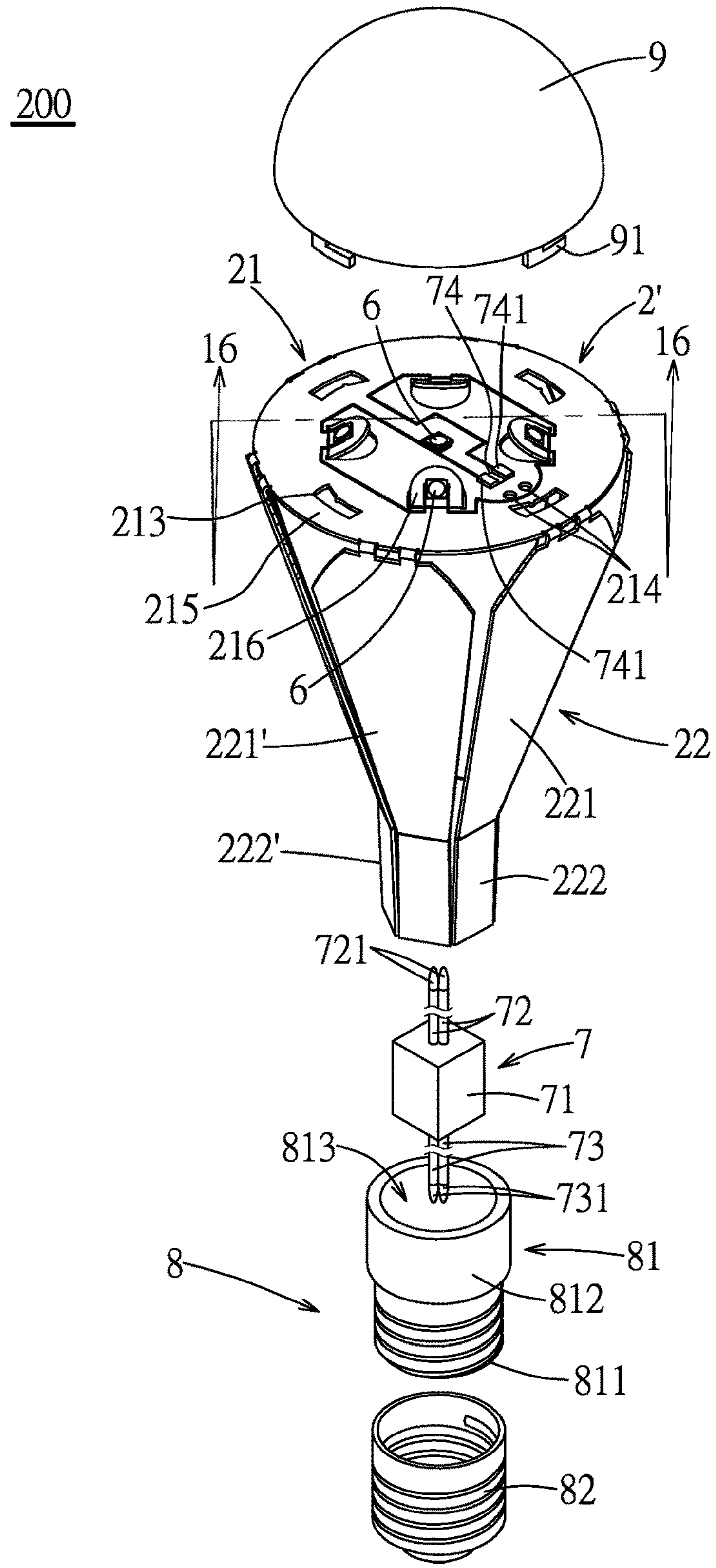
FIG. 14 is an exploded perspective view of an LED lighting fixture made by the first embodiment.
Figure 15:
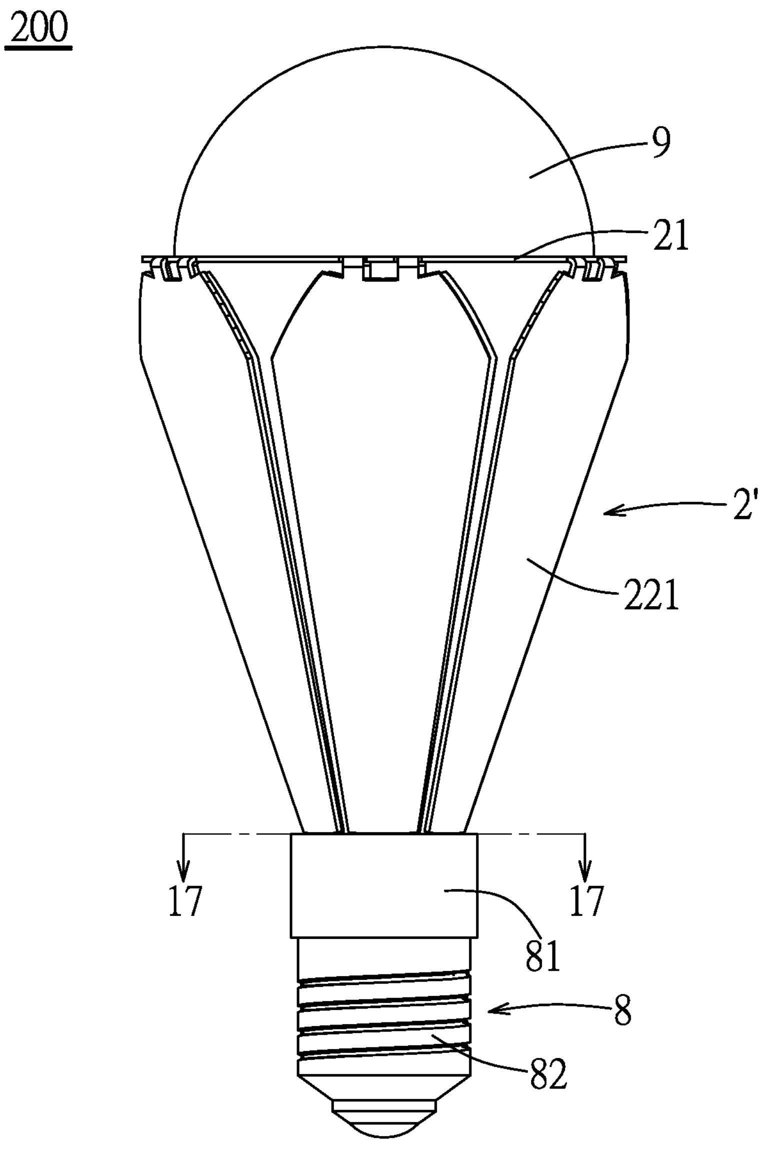
FIG. 15 is a side view of the LED lighting fixture made by the first embodiment.

Referring to FIGS. 10 and 14, in step D), a driver module 7 is installed and brought into electrical contact with the patterned circuit 5. The driver module includes a driving circuit unit 71, two first transmission lines 72 connected to the driving circuit unit 71, two second transmission lines 73 connected to the driving circuit unit 71 and opposite to the first transmission lines 72, and an adapter board 74 having a pair of electrodes 741. The electrodes 741 of the adapter board 74 are soldered to two conductive portions 51 of the patterned circuit 5. The first transmission lines 72 are respectively passed through the through-holes 214 in the central piece 21, and a conductive portion 721 of each of the first transmission lines 72 is soldered to a corresponding one of the electrodes 741 of the adapter board 74 such that the driving circuit unit 71 is brought into electrical connection with the patterned circuit 5 via the first transmission lines 72 and adapter board 74.

Referring to FIGS. 5, 12, 13, and 14, in step E), the flat plate 2 is positioned in a first female mold part (not shown) of a punching machine (not shown). A first male mold part (not shown) matching the first female mold part is then used to punch to the flap portions 216 of the central piece 21 so as to bend each of the flap portions 216 along the bent line forwardly and at an angle (A) relative to the circumferential region 215. The flat plate 2 is then positioned in a second female mold part (not shown) of the punching machine such that the driving circuit unit 71 of the driver module 7 is disposed downwardly of the central piece 21. A second male mold part (not shown) matching the second female mold part is then used to punch to the peripheral extensions 22 so as to bend the peripheral extensions 22 rearwardly relative to the central piece 21 and toward the central axis (X) such that the bent peripheral extensions 22 collectively form a shell 2' which includes a skirt segment 221' and an insert segment 222' that are proximate to and distal from the central piece 21, respectively. The skirt segment 221' is composed of the elongate portions 221 and encloses the driver module 7, and the insert segment 222' is composed of the distal end portions 222.

Figure 13:
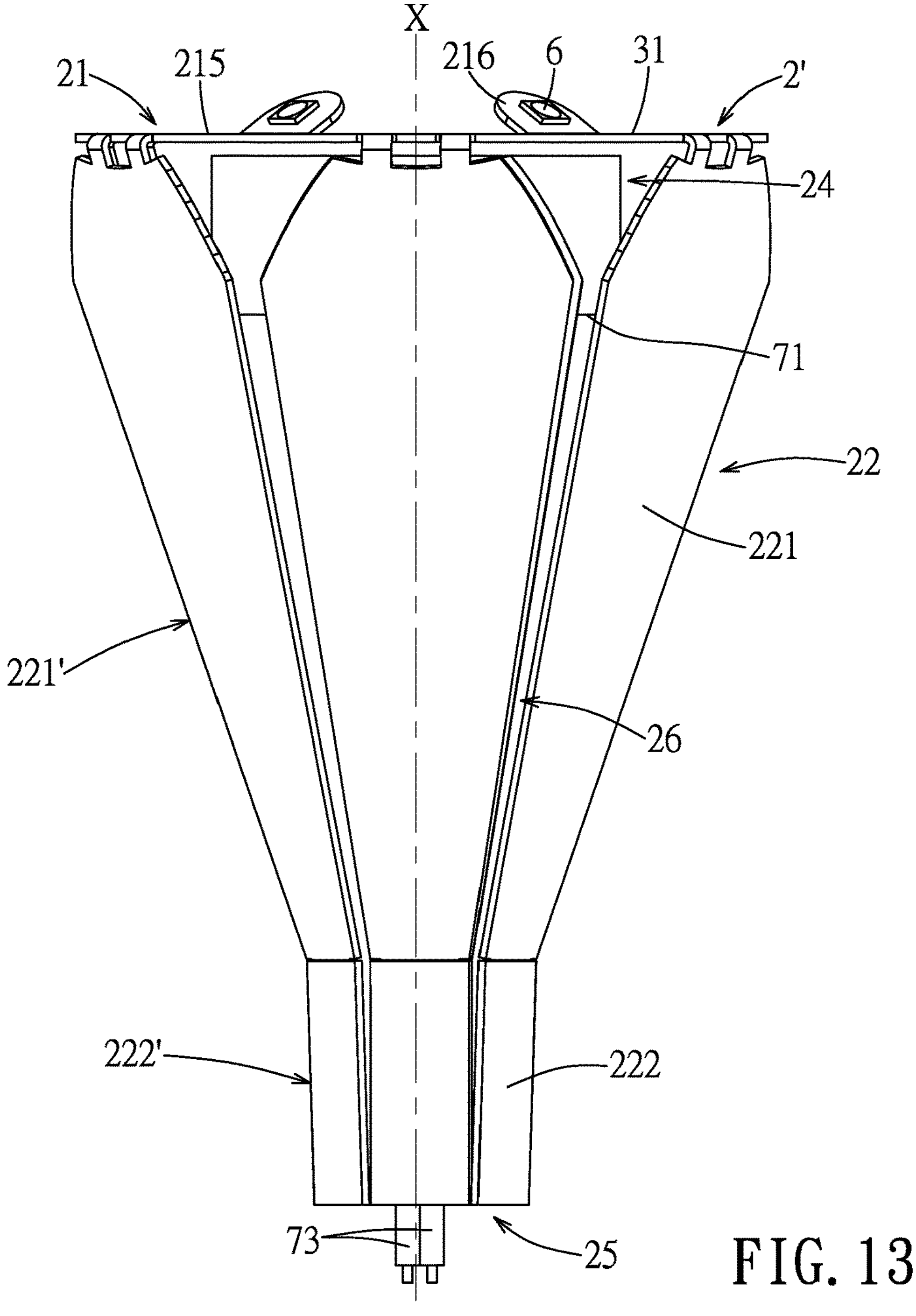
FIG. 13 is a side view of a shell formed by bending the flat plate.
Figure 16:
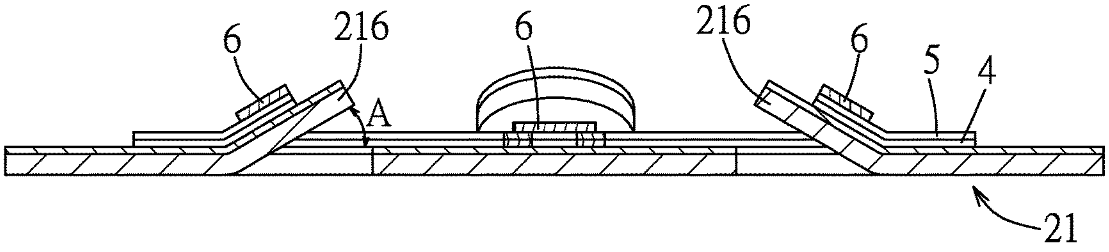
FIG. 16 is a sectional view taken long line 16-16 of FIG. 14.

Referring to FIGS. 13, 14, and 16, each of the flap portions 216 is bent at an angle (A) relative to the circumferential region 215, and the peripheral extensions 22, specifically the elongate portions 221 thereof, are bent rearwardly relative to the central piece 21 and toward the central axis (X) via step E). Therefore, the LED dies 6 respectively mounted on the flap portions 216 are oriented in various directions such that light emitted by the LED dies 6 can illuminate a relatively large area. In the embodiment, the angle (A) is about 45°. It should be noted that the angle (A) may be adjusted to be within the range of, for example, from 1° to 90° using a punching machine with suitable male and female mold parts.

The central piece 21 and the peripheral extensions 22 cooperatively define a receiving space 24. The ends of the distal end portions 222 cooperatively define an opening 25. Two adjacent ones of the peripheral extensions 22 define a gap 26 therebetween. The receiving circuit unit 71 is received in the receiving space 24, and the second transmission lines 73 pass through the opening 25. The heat produced by the LED dies 6 during operation may be dissipated through the patterned circuit 5 and the shell 2' formed by the flat plate 2. Moreover, since air may be circulated through the gaps 26, the heat dissipation effect may be further enhanced, thereby increasing the service life of the LED dies 6.

Figure 17:
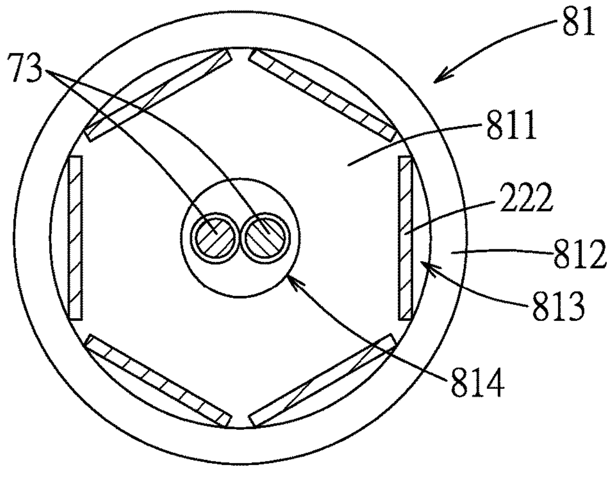
FIG. 17 is a sectional view taken long line 17-17 of FIG. 15.
Figure 18:
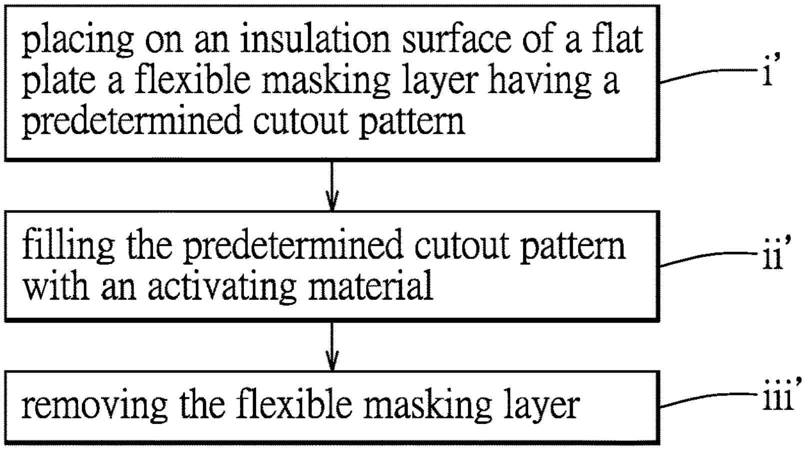
FIG. 18 is a flow diagram illustrating a step of forming a patterned activating material layer in a second embodiment of a method for making an LED lighting fixture according to the disclosure.

Referring to FIGS. 14 and 17, in step F), the insert segment 222' is press-fitted into a lamp base 8 so as to form a snug engagement therebetween. The lamp base 8 includes a sleeve member 81 and a cap member 82 threadedly engaged with the sleeve member 81. The sleeve member 81 includes a bottom wall 811 and a surrounding wall 812 extending upwardly from a periphery of the bottom wall 811. The bottom wall 811 and the surrounding wall 812 cooperatively define a recess 813. The bottom wall 811 is formed with a through-hole 814 communicated with the recess 813.

Specifically, in step F), the second transmission lines 73 are passed through the recess 813 and the through-hole 814 so as to extend outwardly of the sleeve member 81. The insert segment 222' is press-fitted into the sleeve member 81. When the insert segment 222' is press-fitted into the sleeve member 81, the bottom ends of the distal end portions 222 abut against the bottom wall 811 and two lateral sides of each of the distal end portions 222 abut against the surrounding wall 812 such that the insert segment 222' is fittingly engaged with the sleeve member 81. Conductive portions 731 of the second transmission lines 73 are then soldered to the cap member 82, which is then screwed to the sleeve member 81. Since the insert segment 222' and the sleeve member 81 are coupled by press-fit engagement, assembly is relatively simple and convenient compared to the prior art shown in FIG. 1. Thus, assembly time and production cost may be reduced.

In step G), anchoring hooks 91 of a lamp cover 9 are respectively inserted into the slots 213 of the central piece 21, and the lamp cover 9 is then rotated through a proper angle relative to the central piece 21 so as to permit the lamp cover 9 to be installed on the central piece 21. An LED lighting fixture 200 is thus made.

It should be noted that the step of bending the peripheral extensions 22 and the step of bending the flap portions 216 may be performed after the step of forming the patterned activating material layer 4 and prior to the step of forming the patterned circuit 5.

Alternatively, the step of bending the peripheral extensions 22 and the step of bending the flap portions 216 may be performed after the step of forming the patterned circuit

5 and prior to the step of bringing the LED dies 6 into electrical contact with the electrical contact pairs 50 of the patterned circuit 5.

Referring to FIG. 2 and FIGS. 18 to 22, the second embodiment of the method for making an LED lighting fixture according to the disclosure is substantially the same as the first embodiment except that the step of forming the patterned activating material layer 4 includes the sub-steps of: i') placing on the insulation surface 31 of the flat plate 2 a flexible masking layer 40 having a predetermined cutout pattern 401; ii') filling the predetermined cutout pattern 401 with an activating material 41; and iii') removing the flexible masking layer 40.

Figure 19:
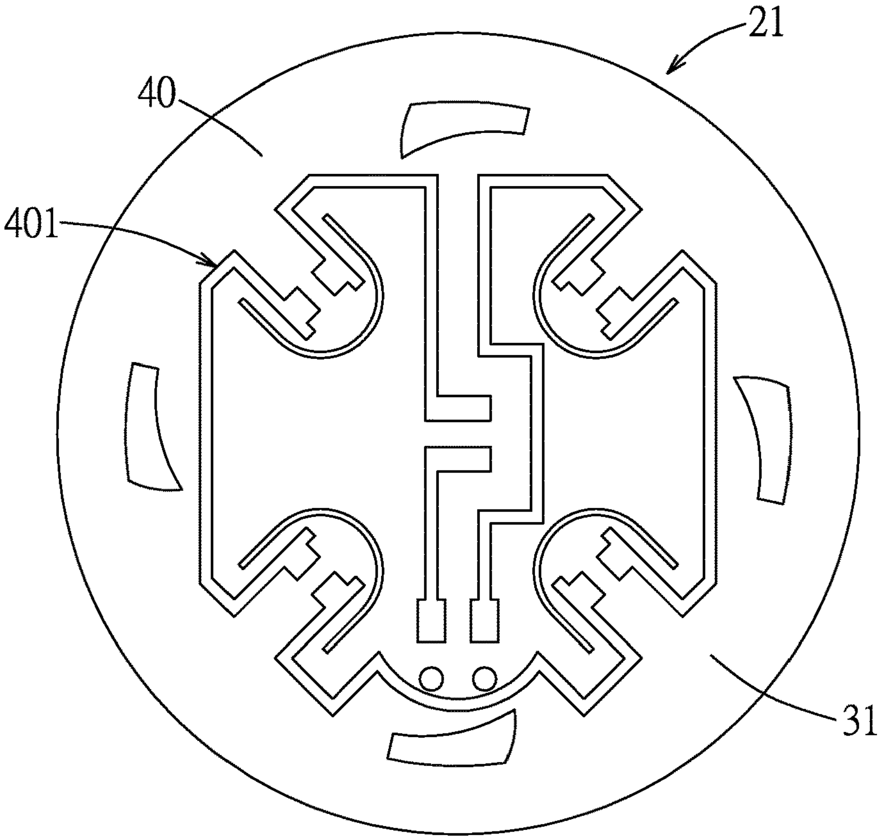
FIG. 19 is a schematic view illustrating the central piece of the flat plate in a state in which a flexible masking layer is placed thereon.
Figure 20:
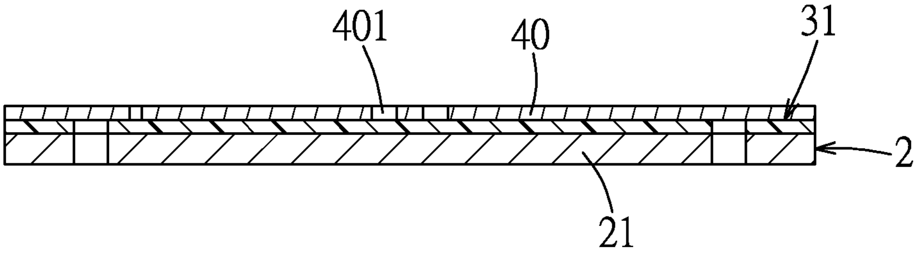
FIGS. 20, 21, and 22 are sectional views illustrating consecutive sub-steps of the step of forming the patterned activating material layer in the second embodiment.

Specifically, as shown in FIGS. 19 and 20, the flexible masking layer 40 having the predetermined cutout pattern 401 is adhered to the insulation surface 31 of the central piece 21 of the flat plate 2.

Figure 21:
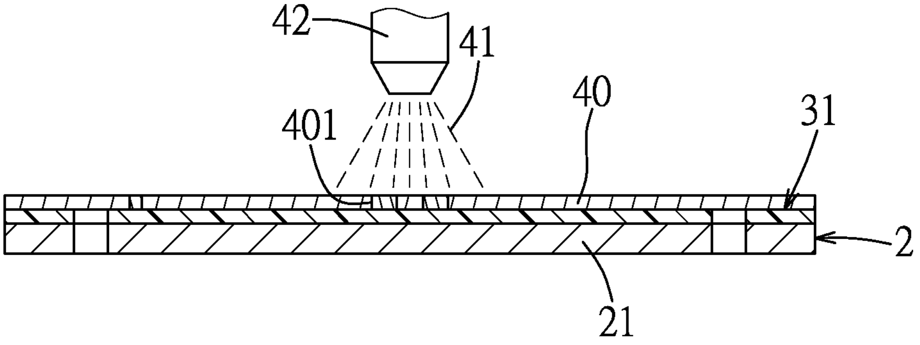

As shown in FIG. 21, the activating material 41 is applied via spraying using a nozzle 42 so as to fill the predetermined cutout pattern 401 with the activating material 41.

Figure 22:
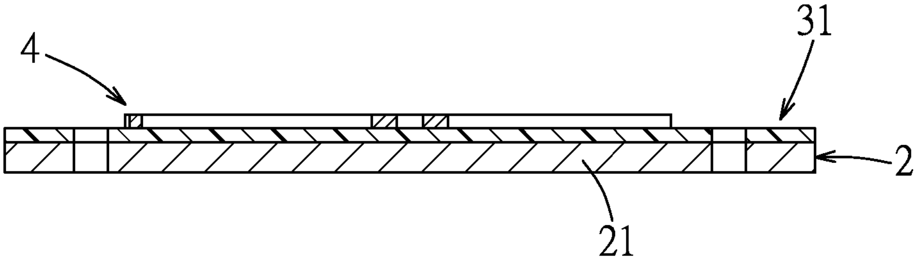

As shown in FIG. 22, the flexible masking layer 40 is removed so as to form the patterned activating material layer 4 on the insulation surface 31.

The second embodiment of the method of the disclosure is relatively flexible since the procedure for forming the patterned activating material layer 4 may be applied to the insulation surface 31 that is flat or curved.

Figure 23:
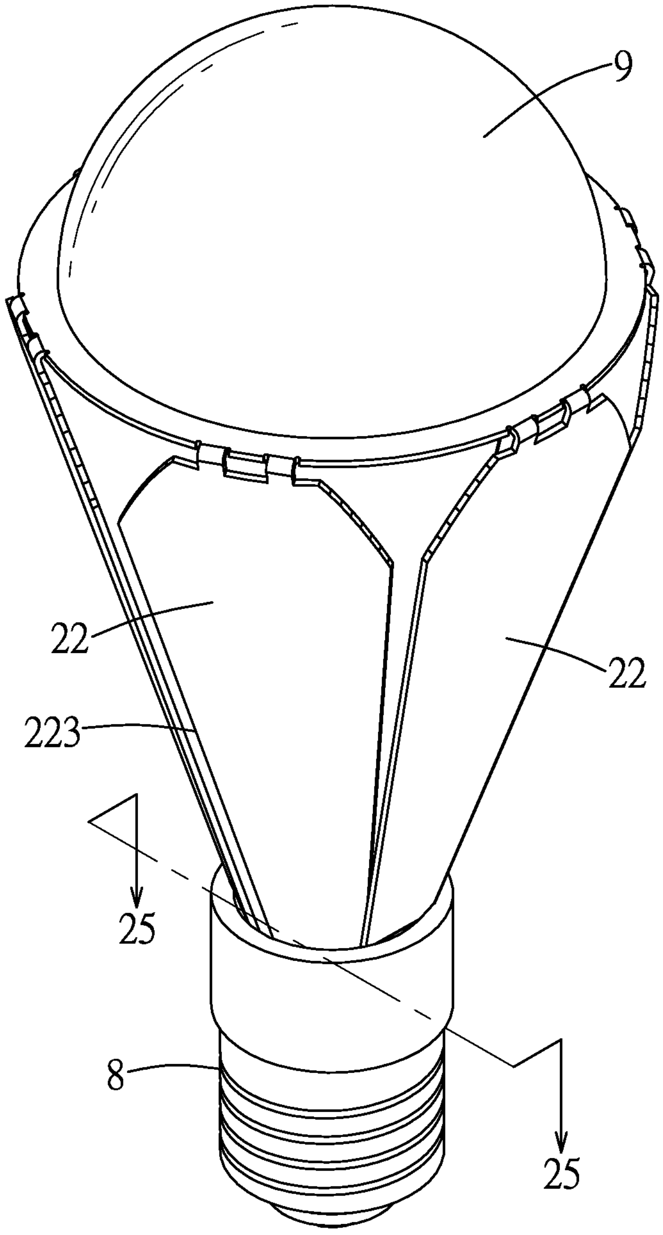
FIG. 23 is a perspective view of a first variation of the LED lighting fixture made by the method of the disclosure.
Figure 24:
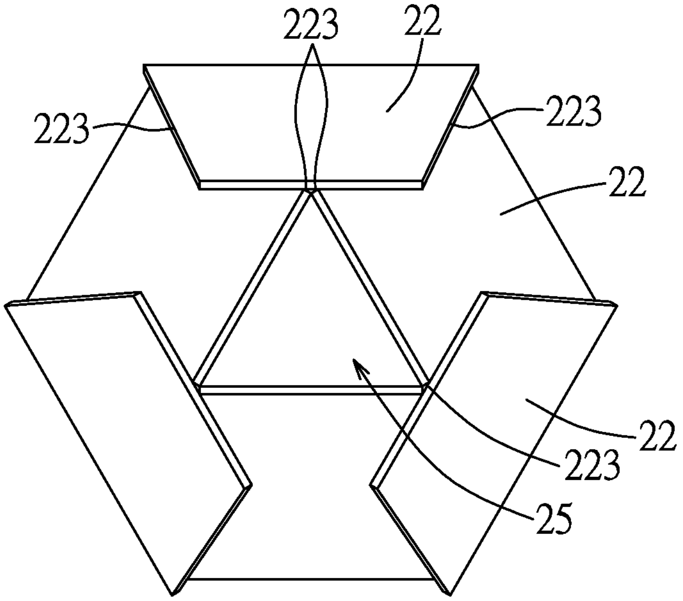
FIG. 24 is a schematic view illustrating a configuration of an insert segment of the first variation of the LED lighting fixture made by the method of the disclosure.
Figure 25:
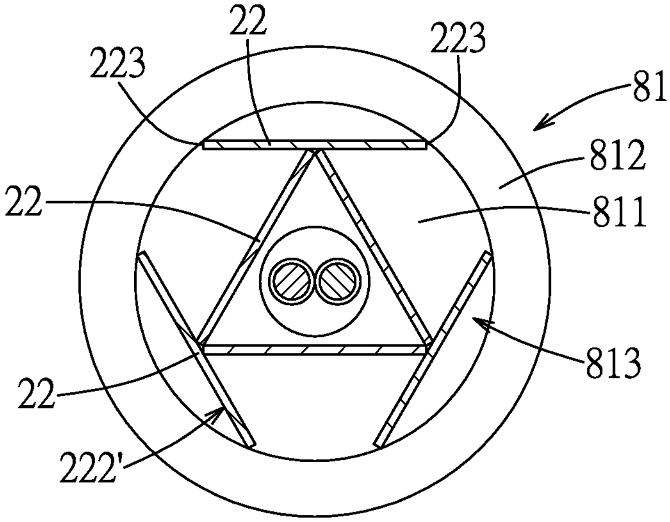
FIG. 25 is a sectional view taken long line 25-25 of FIG. 23.

FIGS. 23, 24, and 25 illustrate a first variation of the LED lighting fixture made by the method of the disclosure, in which the number of the peripheral extensions 22 is even (6 in the illustrated variation). Each of the peripheral extensions 22 has two lateral sides 223 opposite to each other. The peripheral extensions 22 are bent such that one of two adjacent peripheral extensions 22 abuts against a corresponding one of the two lateral sides 223 of the other of the two adjacent peripheral extensions 22 so as to permit three inner ones of the six peripheral extensions 22 to cooperatively define a triangular opening 25 and to permit each of three outer ones of the six peripheral extensions 22 to abut against corresponding ones of the lateral sides 223 of the corresponding ones of the three inner ones of the peripheral extensions 22. Moreover, when the insert segment 222' is press-fitted into the sleeve member 81 of the lamp base 8, the lateral sides 223 of the three outer ones of the six peripheral extensions 22 abut against the sleeve member 81.

Figure 26:
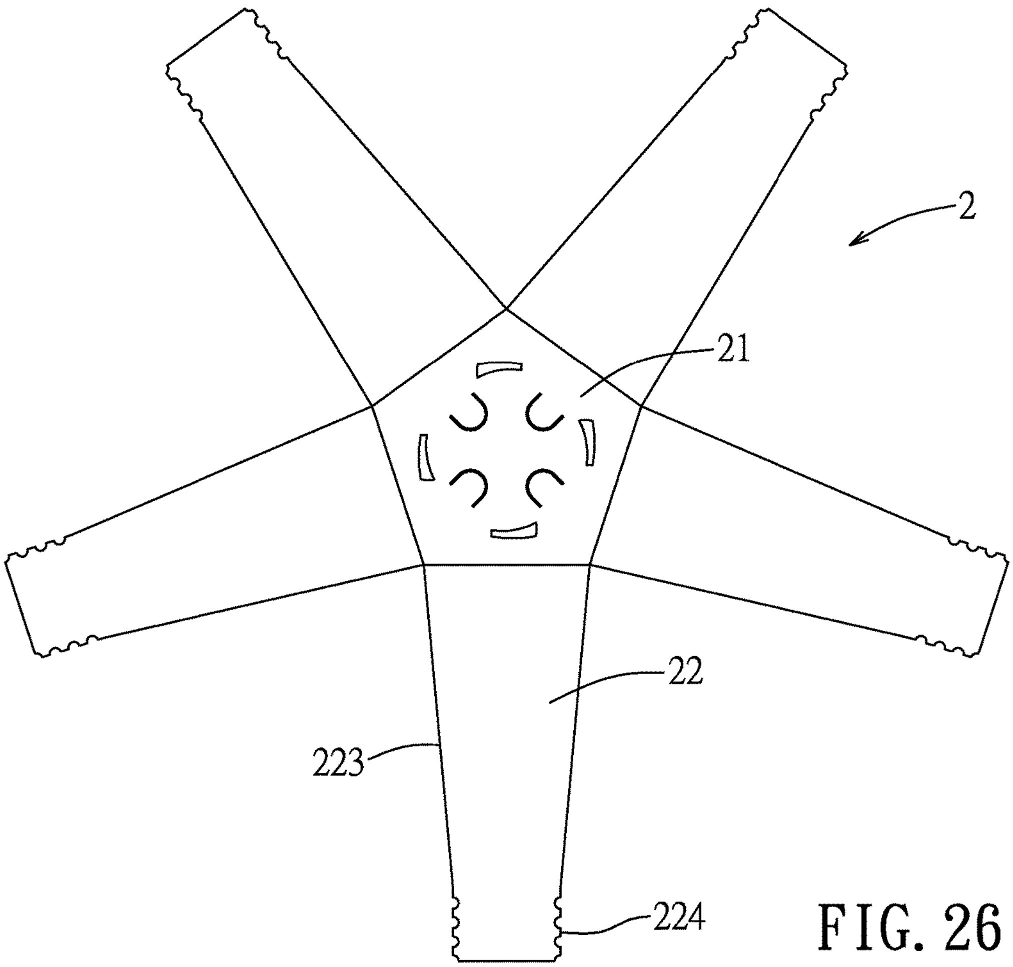
FIG. 26 is a schematic view of a flat plate for a second variation of the LED lighting fixture made by the method of the disclosure.
Figure 27:
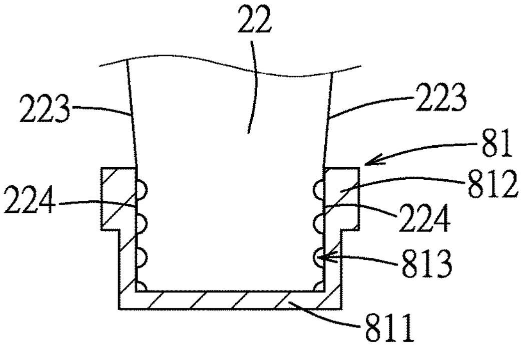
FIG. 27 is a fragmentary sectional view illustrating an insert segment press-fitted into a lamp base in the second variation of the LED lighting fixture made by the method of the disclosure.

FIGS. 26 and 27 illustrate a second variation of the LED lighting fixture made by the method of the disclosure, in which the central piece 21 of the flat plate 2 is in a polygonal form, and in which each of the peripheral extensions 22 has two lateral sides 223. Each of the lateral sides 223 is indented to form a plurality of protrusions 224 spaced part from each other and distal from the central piece 21. When the peripheral extensions 22 after bending are press-fitted into the sleeve member 81, the protrusions 224 abut against an inner wall surface of the sleeve member 81.

Figure 28:
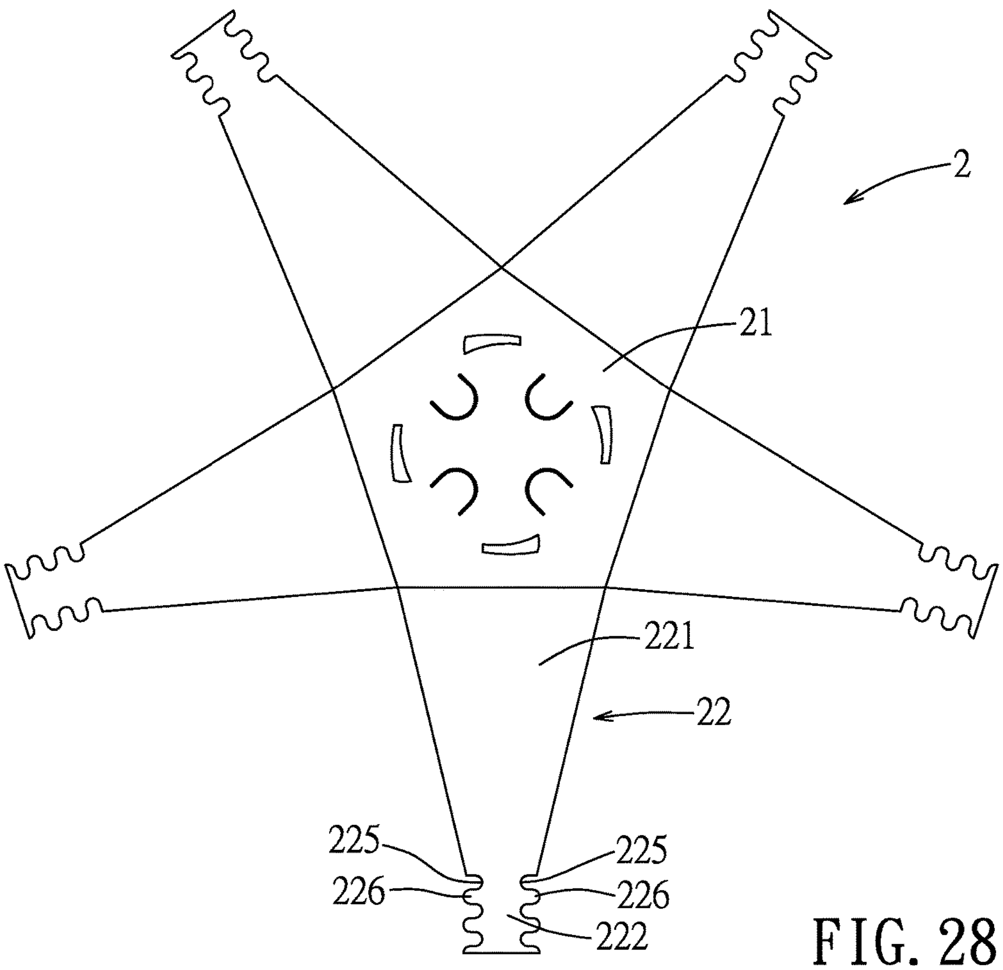
FIG. 28 is a schematic view of a flat plate for a third variation of the LED lighting fixture made by the method of the disclosure.
Figure 29:
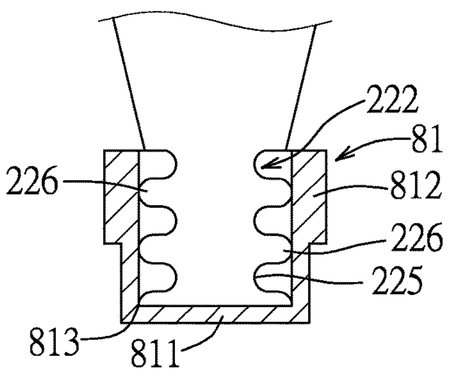
FIG. 29 is a fragmentary sectional view illustrating an insert segment press-fitted into a lamp base in the third variation of the LED lighting fixture made by the method of the disclosure.

FIGS. 28 and 29 illustrate a third variation of the LED lighting fixture made by the method of the disclosure, in which the central piece 21 of the flat plate 2 is in a polygonal form, and in which the distal end portion 222 of each of the peripheral extensions 22 has two lateral sides 225. Each of the lateral sides 225 is indented to form a plurality of protrusions 226 spaced part from each other and distal from the central piece 21. When the distal end portion 222 of each of the peripheral extensions 22 after bending are press-fitted into the sleeve member 81, the protrusions 226 abut against an inner wall surface of the sleeve member 81.

Figure 30:
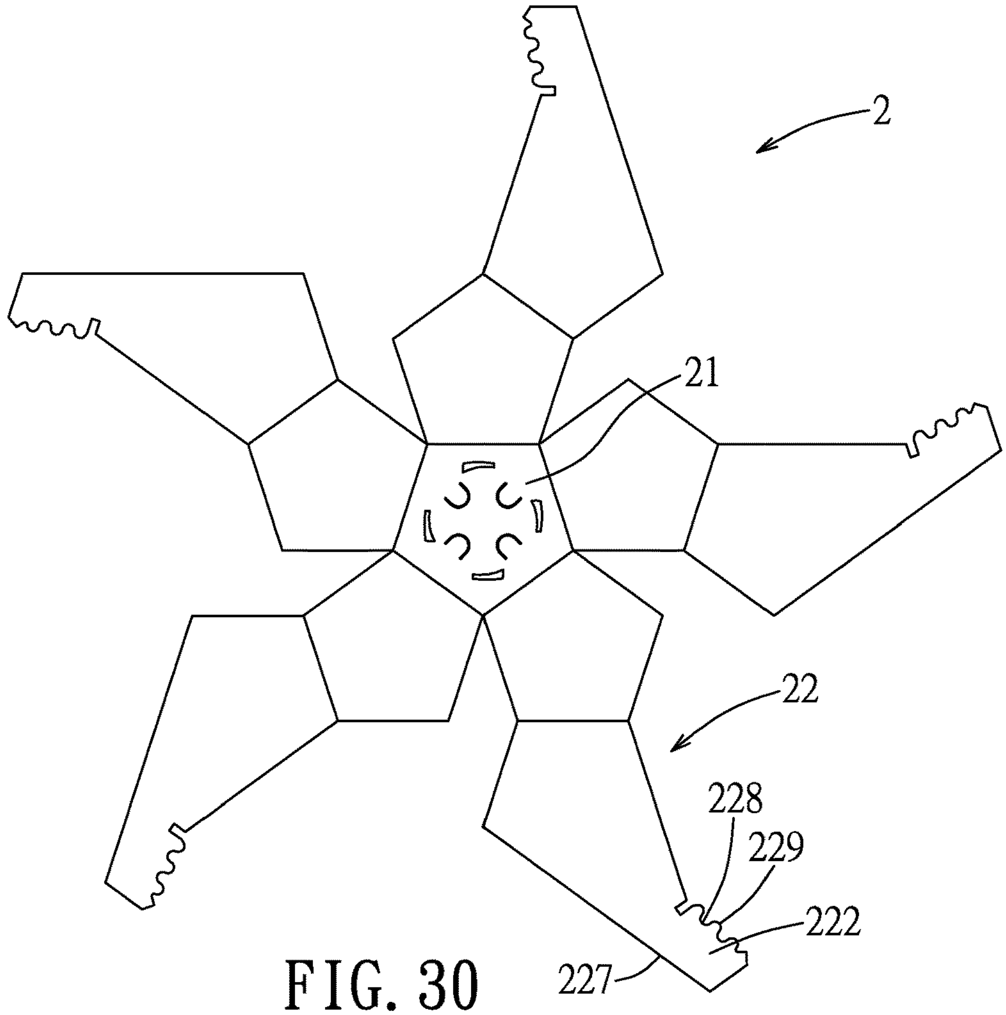
FIG. 30 is a schematic view of a flat plate for a fourth variation of the LED lighting fixture made by the method of the disclosure.
Figure 31:
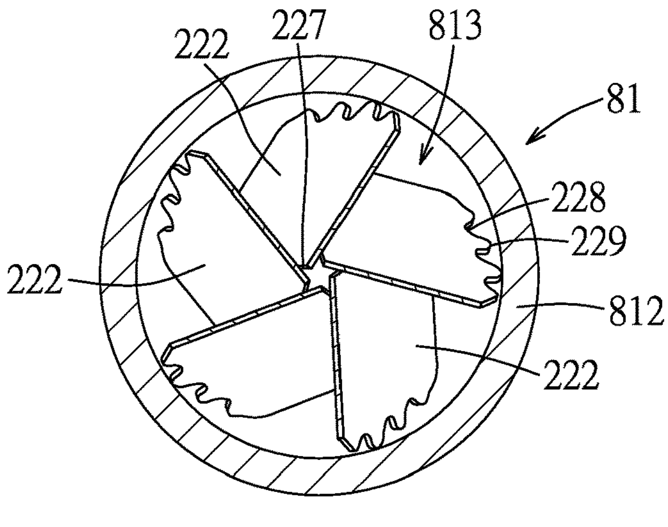
FIG. 31 is a fragmentary sectional view illustrating an insert segment press-fitted into a lamp base in the fourth variation of the LED lighting fixture made by the method of the disclosure.

FIGS. 30 and 31 illustrate a fourth variation of the LED lighting fixture made by the method of the disclosure, in which the central piece 21 of the flat plate 2 is in a polygonal form, and in which the distal end portion 222 of each of the peripheral extensions 22 has a first lateral side 227 and a second lateral side 228 opposite to each other. The second lateral side 228 of the distal end portion 222 of each of the peripheral extensions 22 is indented to form a plurality of protrusions 229 spaced part from each other. When the peripheral extensions 22 are bent, the distal end portion 222 of one of two adjacent peripheral extensions 22 abuts against the first lateral side 227 of the distal end portion 222 of the other of the two adjacent peripheral extensions 22 such that the distal end portions 222 of the peripheral extensions 22 are arranged in a radiating manner. When the distal end portions 222 of the peripheral extensions 22 are press-fitted into the sleeve member 81, the protrusions 229 abut against an inner wall surface of the sleeve member 81.

Figure 32:
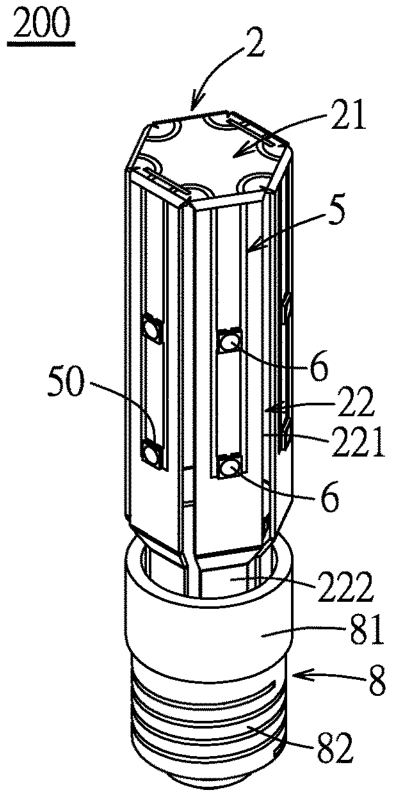
FIGS. 32 and 33 are perspective views illustrating a fifth variation of the LED lighting fixture made by the method of the disclosure.
Figure 33:
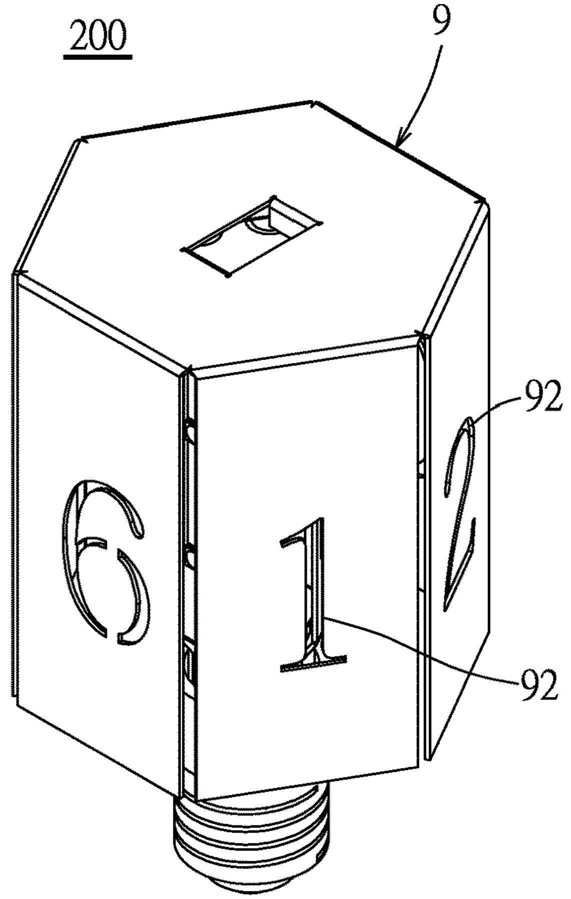

FIGS. 32 and 33 illustrate a fifth variation of the LED lighting fixture 200 made by the method of the disclosure, in which the electrical contact pairs 50 of the patterned circuit 5 are formed on the elongate portion 221 of each of the peripheral extensions 22, and the LED dies 6 are mounted on the elongate portions 221 of the peripheral extensions 22 and oriented in different various directions. The lamp cover 9 in the fifth variation of the LED lighting fixture 200 is a light-tight shading cover formed with various light-transmitting patterns 92, which are numbers in the illustrated variation. The lamp cover 9 is snap-engaged with the central piece 21.

Figure 34:
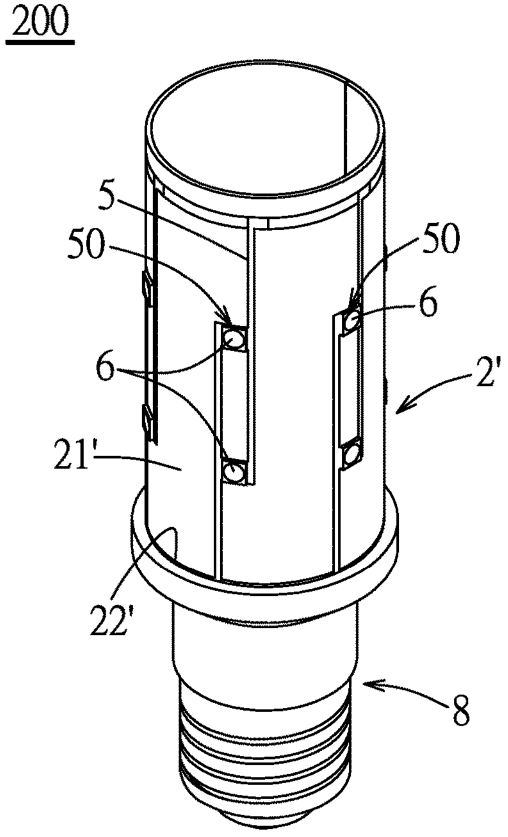
FIGS. 34 and 35 are perspective views illustrating an LED lighting fixture made by a second embodiment of the method of the disclosure.
Figure 35:
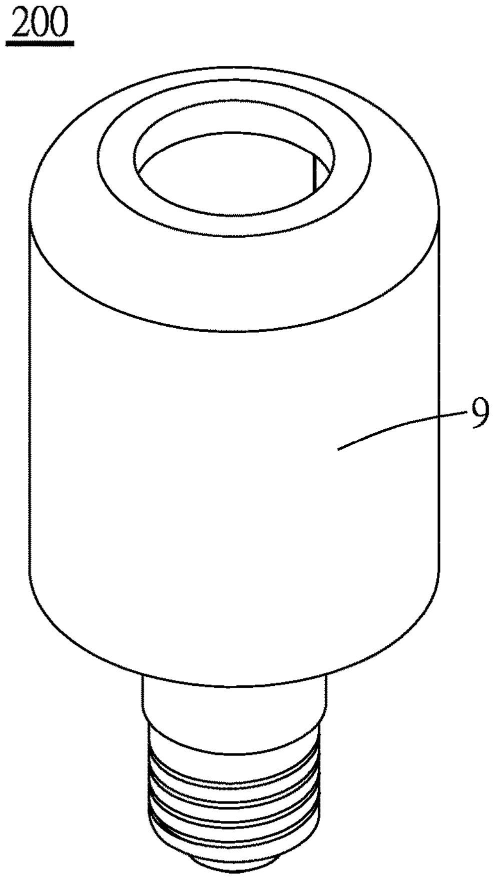

FIGS. 34 and 35 illustrate an LED lighting fixture 200 made by a third embodiment of a method for making an LED lighting fixture according to the disclosure. The third embodiment of the method of the disclosure includes the steps of:

A1) cutting a flat blank to form a rectangular flat plate including an upper marginal portion, a lower marginal portion opposite to the upper marginal portion in a longitudinal direction, and a body portion disposed between the upper and lower marginal portions;

B1) forming on the body portion of the rectangular flat plate a patterned circuit 5 which includes a plurality of electrical contact pairs 50 that are displaced from each other;

C1) bringing a plurality of LED dies 6 into electric contact with the electrical contact pairs 50, respectively;

D1) rolling up the rectangular flat plate around an axis oriented in the longitudinal direction to form a tubular shell 2' which includes a tubular body 21' corresponding to the body portion and an insert segment 22' corresponding to the lower marginal portion;

E1) press-fitting the insert segment 22' into a lamp base 8; and

F1) securing a lamp cover 9 on an upper end portion of the tubular shell 2' by, e.g., snap engagement.

In the method for making an LED lighting fixture according to the disclosure, since the insert segment 222', 22' is press-fitted into the sleeve member 81 of the lamp base 8, assembly is relatively simple and convenient compared to the prior art shown in FIG. 1. Thus, the assembly time and production cost for the LED lighting fixture 200 made by the method of the disclosure may be reduced. In addition, since the LED dies 6 mounted on the LED light fixture 200 made by the method of the disclosure are oriented in different directions, the light emitted by the LED dies 6 can illuminate a relatively large area. Furthermore, the heat produced by the LED dies 6 may be dissipated by the patterned circuit 5 and the shell 2' formed by the flat plate 2. Thus, the heat conductivity and the heat dissipation effect of the LED lighting fixture 200 made by the method of the disclosure may be enhanced.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for making an LED lighting fixture, comprising the steps of:

a) cutting a flat blank to form a flat plate including
 a central piece having a central region defining a central axis and a circumferential region surrounding the central region, and
 a plurality of peripheral extensions which extend radially from the circumferential region and which are angularly displaced from each other about the central axis;

b) forming on the flat plate a patterned circuit which includes a plurality of electrical contact pairs that are formed on the central piece or the peripheral extensions and that are angularly displaced from each other about the central axis;

c) bringing a plurality of LED dies into electrical contact with the electrical contact pairs respectively; and d) bending the peripheral extensions rearwardly relative to the central piece and toward the central axis to form a shell.

2. The method according to claim 1, wherein the shell includes a skirt segment and an insert segment which are proximate to and distal from the central piece, respectively.

3. The method according to claim 2, further comprising a step of press-fitting the insert segment into a lamp base.

4. The method according to claim 1, wherein in step b), the electrical contact pairs of the patterned circuit are formed on the peripheral extensions.

5. The method according to claim 1, wherein in step b), the electrical contact pairs of the patterned circuit are formed on the circumferential region of the central piece, the method further comprising the steps of b1) slitting the circumferential region to form a plurality of flap portions each having a respective one of the electrical contact pairs and each having a free end proximate to the central region and a bent line radially opposite to the free end, and b2) bending each of the flap portions along the bent line forwardly and at an angle relative to the circumferential region.

6. The method according to claim 1, wherein the flat plate has an insulation surface for forming the patterned circuit thereon.

7. The method according to claim 6, wherein the flat plate is made from a metal plate provided with an insulation layer having the insulation surface.

8. The method according to claim 6, wherein step b) includes the sub-steps of: i) forming a patterned activating material layer on the insulation surface of the flat plate; and ii) performing chemical plating on the patterned activating material layer to form the patterned circuit on the patterned activating material layer.

9. The method according to claim 8, wherein the step of forming the patterned activating material layer includes the sub-steps of: i') placing on the insulation surface of the flat plate a flexible masking layer having a predetermined cutout pattern; ii') filling the predetermined cutout pattern with an activating material; and iii') removing the flexible masking layer.

10. The method according to claim 6, wherein step b) includes the sub-steps of: i) forming an activating material layer on the insulation surface of the flat plate; ii) performing chemical plating on the activating material layer to form an electrical conductive layer on the activating material layer; and iii) removing unwanted portions of the activating material and electrical conductive layers to thereby form the patterned circuit on the insulation surface.

* * * * *